(12) United States Patent
Wu

(10) Patent No.: US 6,262,580 B1
(45) Date of Patent: Jul. 17, 2001

(54) METHOD AND TESTING SYSTEM FOR MEASURING CONTACT RESISTANCE FOR PIN OF INTEGRATED CIRCUIT

(75) Inventor: Tsung-Chih Wu, Hsinchu Hsien (TW)

(73) Assignees: United Microelectronics Corp; United Silicon Incorporated, both of Hsinchu (TW)

( * ) Notice: Subject to any disclaimer, the term of this patent is extended or adjusted under 35 U.S.C. 154(b) by 0 days.

(21) Appl. No.: 09/417,508

(22) Filed: Oct. 14, 1999

(51) Int. Cl.[7] .......................... G01R 29/26; G01R 31/02; G01R 31/26
(52) U.S. Cl. .......................... 324/713; 324/763; 324/765; 324/711; 324/538
(58) Field of Search .................................. 324/713, 763, 324/765, 538, 711

(56) References Cited

U.S. PATENT DOCUMENTS

| | | | |
|---|---|---|---|
| 5,557,209 | * 9/1996 | Crook et al. | 324/537 |
| 5,631,572 | * 5/1997 | Sheen et al. | 324/754 |
| 5,696,451 | * 12/1997 | Keirn et al. | 324/687 |
| 6,008,664 | * 12/1999 | Jett et al. | 324/765 |
| 6,097,203 | * 8/2000 | Parker et al. | 324/763 |
| 6,104,198 | * 8/2000 | Brooks | 324/538 |

FOREIGN PATENT DOCUMENTS

11101849A * 9/1997 (JP) .............................. G01R/31/26

* cited by examiner

Primary Examiner—Glenn W. Brown
Assistant Examiner—Wasseem H. Hamdan
(74) Attorney, Agent, or Firm—Thomas, Kayden, Horstemeyer & Risley, LLP

(57) ABSTRACT

A method and a testing system for measuring contact resistance of a pin on an integrated circuit. An RC circuit is coupled to the integrated circuit, and a response signal of a testing signal input to the integrated circuit is monitored. The response signal has a time dependent voltage V'. Another time dependent voltage $V_1$ for the testing signal through the RC circuit and a voltage drop across an internal circuit of the integrated circuit is illustrated. Comparing V' with $V_1$, whether the contact resistance of the pin being tested is allowable can be determined according to the ratings or specification of the integrated circuit.

6 Claims, 5 Drawing Sheets

METHOD AND TESTING SYSTEM FOR MEASURING CONTACT RESISTANCE FOR PIN OF INTEGRATED CIRCUIT

BACKGROUND OF THE INVENTION

1. Field of the Invention

The invention relates in general to a method and a testing system for measuring contact resistance. More particularly, the invention relates to a method and a testing system used for measuring contact resistance of pins of an integrated circuit.

2. Description of the Related Art

In the conventional method for measuring a contact resistance, for example, an open/short circuit method, a voltage of a device is measure while applying the device with a direct current. In FIG. 1, the circuit diagram for a conventional method to determine whether the contact is good or poor is illustrated. In the circuit, a current flows into an integrated circuit chip 100 from a voltage input source 120. The testing device 150 (a probe) extracts a certain amount of the current from a signal pin 110, while the voltage difference is measured across the signal pin 110 and the voltage input source 120. Using the voltage input source 120 as a reference standard, that is, assuming the voltage input source 120 is at a level of 0 volt, if the signal pin 110 has a voltage level between −0.3 volt to −1.5 volt, the signal pin 110 is determined to be a good contact. Otherwise, beyond this range, the signal pin 110 has a bad contact.

As shown in FIG. 1, the voltage difference across the signal pin 110 and the voltage input source 120 is equivalent to a voltage across a diode 130 of about 0.7 volt. If the voltage input source 120 has a voltage level of 0 volt, the pin signal 110 then has a voltage of −0.7 volt that falls within the normal operating range (−0.3 to −1.5 volt).

Typically, the amount of the extracted current is as small as about 100 micro-amperes ($\mu$A). Thus, even if the signal pin 110 is in bad contact with the probe 150 to form a non-Ohmic contact, that is, there is a voltage drop across the contact, or when the contact resistance is high, the open/short circuit test might still pass. As a result, the integrated circuit fails in the function test.

For example, while the extracted current is 100 micro-amperes, and the contact resistance is 900 Ohms ($\Omega$), the voltage drop is only 0.09 volt. The variation is about 12.86%. Plus the original voltage difference of 0.7 volt, the total voltage difference is 0.79 which is still within the tolerable range. Therefore, the signal pin with a contact resistance as high as 900 Ohms passes the open/short circuit test. However, this high contact resistance may cause error results while performing the function test.

As described above, the conventional circuit or method to measure the contact resistance has a very low sensitivity according to the contact resistance. Therefore, even with a bad contact of the pin, it can still pass the open/short circuit test but fails in the function test to cause an error.

SUMMARY OF THE INVENTION

The invention provides a testing system for measuring a contact resistance of a signal pin on an integrated circuit comprising the signal pin, a voltage source pin and an internal circuit. The testing system comprises a testing circuit and a tester. The testing circuit comprises an RC circuit coupled to the signal pin and the voltage source pin and two switches to control the on/off states of the testing circuit. The tester comprises a voltage source and a channel, wherein the voltage source is coupled to the RC testing circuit and the channel is coupled to the signal pin.

In the above structure, an RC circuit is coupled to both the tester and the integrated circuit. With the addition of the RC circuit, even if the contact resistance is very small, the voltage level with this contact resistance experiences an RC effect which can be easily observed. Therefore, the problems occurring in the conventional circuit are resolved.

The invention further provides a method of testing the contact resistance of a pin on an integrated circuit. An RC circuit is provided. A diode with a voltage level equivalent to a voltage drop across an internal circuit of the integrated circuit is added to the RC circuit. A testing signal is input to the RC circuit with the diode. A reference voltage level $V_1$ of a reference response signal to the testing signal is obtained. The integrated circuit is coupled with the RC circuit via the signal pin and a voltage source pin on the integrated circuit. The testing signal is input to the voltage source pin through the RC circuit. A voltage level V' of a response signal obtained at the signal pin is measured. The voltage level V' is compared to the reference voltage level $V_1$ to obtain a difference in voltage that reflects the magnitude of contact resistance of the signal pin.

In addition, the method may also include steps of inputting the testing signal to the RC circuit without the diode and obtaining the voltage level V" of the response signal. The voltage level V" gives an indication of the operating status of the internal circuit.

Both the foregoing general description and the following detailed description are exemplary and explanatory only and are not restrictive of the invention, as claimed.

BRIEF DESCRIPTION OF THE DRAWINGS

FIG. 5b shows a diagram of a time dependent voltage of the response signal that experiences the RC (resistance-capacitance) effect while the contact resistance of the signal pin is assumed to be zero as shown in FIG. 5a;

FIG. 6b shows a diagram of a time dependent voltage of the response signal obtained from the circuit as shown in FIG. 6a;

FIG. 7b shows a time dependent voltage of a response signal of the circuit in FIG. 7a.

DESCRIPTION OF THE PREFERRED EMBODIMENTS

Figure 1:
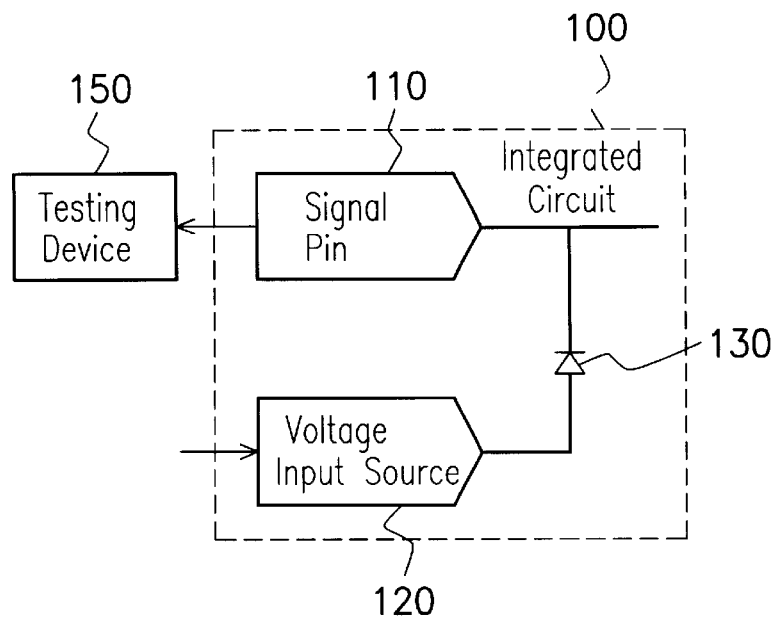
FIG. 1 shows a circuit diagram of a conventional open/short circuit test system.
Figure 2:
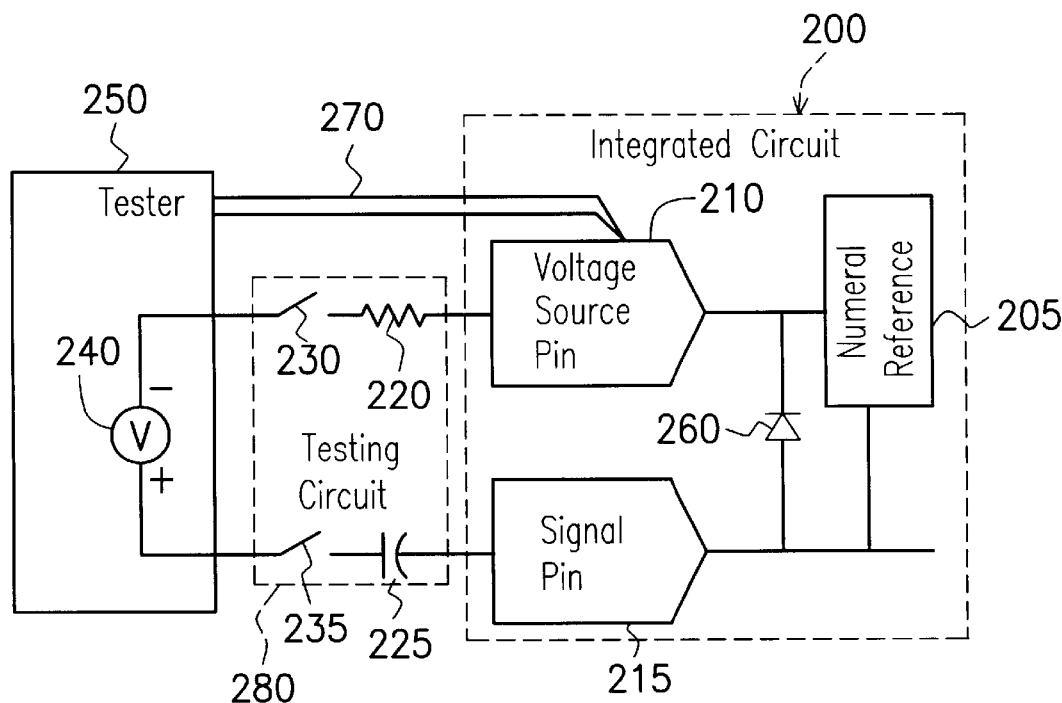
FIG. 2 is a circuit diagram of a testing system used for measuring the contact resistance of a pin according to an embodiment of the invention.

In FIG. 2, a connecting relationship between elements of a testing system in one embodiment of the invention is illustrated. The testing system comprises an integrated circuit 200, a tester 250 and a testing circuit 280. The integrated circuit 200 comprises a voltage source pin 215 and a signal pin 210. The voltage source pin 215 is to receive a testing signal for testing the integrated circuit 200. It is to be noted that the integrated circuit 200 does not only comprise these two pins 210 and 215. The pins other than the voltage source pin 215 and the signal pin 210 are treated as an integral, and together with other internal circuitry, is termed as an internal circuit and denoted by a numeral reference 205 in the integrated circuitry 200 in this embodiment.

The testing circuit 280 comprises a resistor-capacitor (RC) circuit and switches 230 and 235. The RC circuit comprises a resistor 220 coupled to the signal pin 210 and a capacitor 225 coupled to the voltage source pin 215. The switches 230 and 235 are used to control the on/off states of the testing circuit 280. In one embodiment of the invention, the resistance of the resistor 220 is about 100 Ohms, while the capacitance of the capacitor 225 is about 1.5 nano-farad (nf).

The tester 250 comprises a voltage source 240 and a channel 270 or similar testing element such as a probe. The voltage source 240 is coupled to both the switches 230 and 235 of the testing circuit 280. Via the signal pin 210, a response signal generated after a test signal passing through the integrated circuit 200 and the testing circuit 280 is measured.

Figure 3:
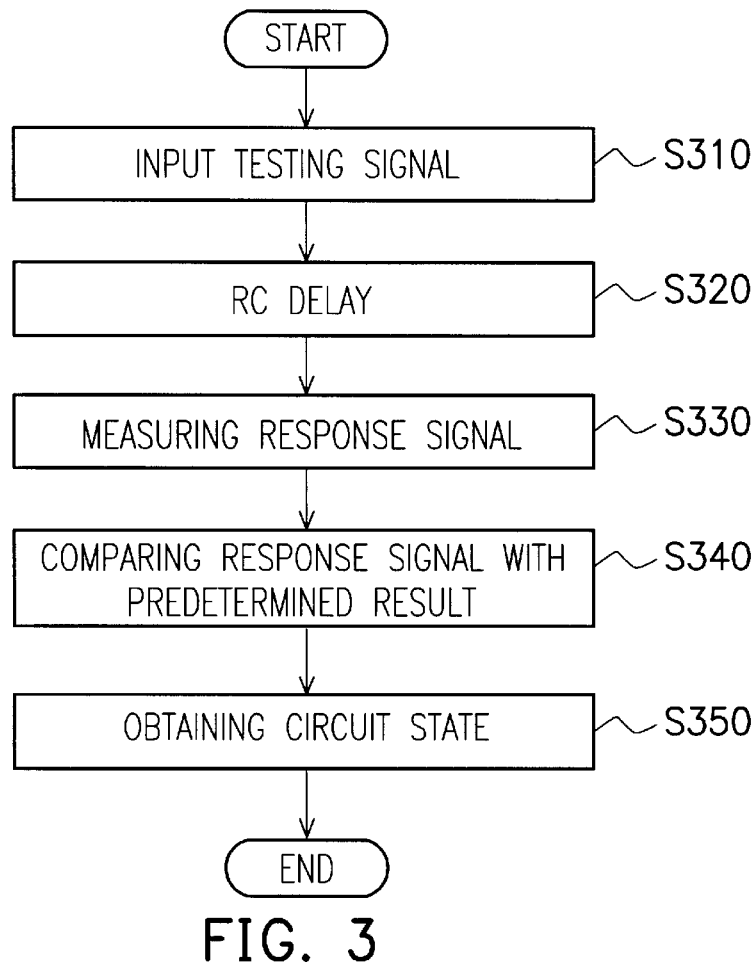
FIG. 3 is a process flow chart of the method provided by an embodiment of the invention.

In FIG. 3, a process flow for operating the testing method of the invention is illustrated. The measurement of a contact resistance of a signal pin 210 in an integrated circuit 200 is taken as an example. The integrated circuit comprises a voltage source pin 215, a RC circuit 280 connected to the integrated circuit 200 via the voltage source pin 215 and the signal pin 210 of which the contact resistance is to be measured.

In step 310, a testing signal is input to the integrated circuit 200 via the voltage source pin 215. In this embodiment, the testing signal is in a form or pattern of a high voltage level as large as about 3 volt.

In step 320, the testing signal passes through the integrated circuit 200 and the RC circuit 280. While passing through the RC circuit 280, an RC delay results in a response signal in step S330. The response signal has the characteristics of the delay effect after the RC circuit 280.

In step S340, the response signal is compared to a predetermined result signal. The predetermined result signal is a response signal for the testing signal transmitting through the RC circuit 280 only. That is, the predetermined result signal is the response signal of the testing signal transmitting through the circuit as shown in FIG. 5a only.

Figure 4:
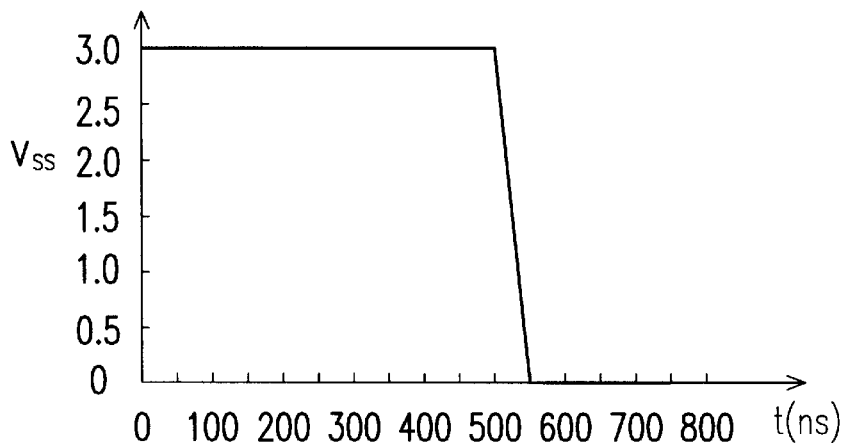
FIG. 4 shows the time dependent voltage of a testing signal applied to the voltage source pin.

In FIG. 4, the voltage of the testing signal as a function of time is illustrated. In this embodiment, the testing signal denoted as Vss in FIG. 4, is at a level of 3 volts before 500 nano-seconds, however, it drops to zero at 550 nano-seconds.

Figure 5A:
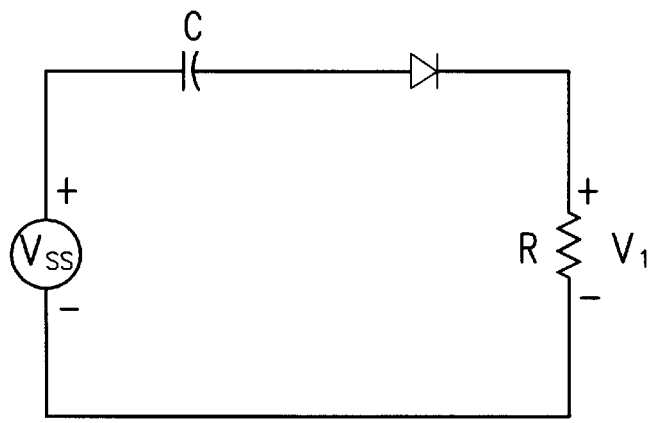
FIG. 5a shows an RC circuit diagram with a diode with an equivalent voltage drop of the internal circuit.
Figure 5B:
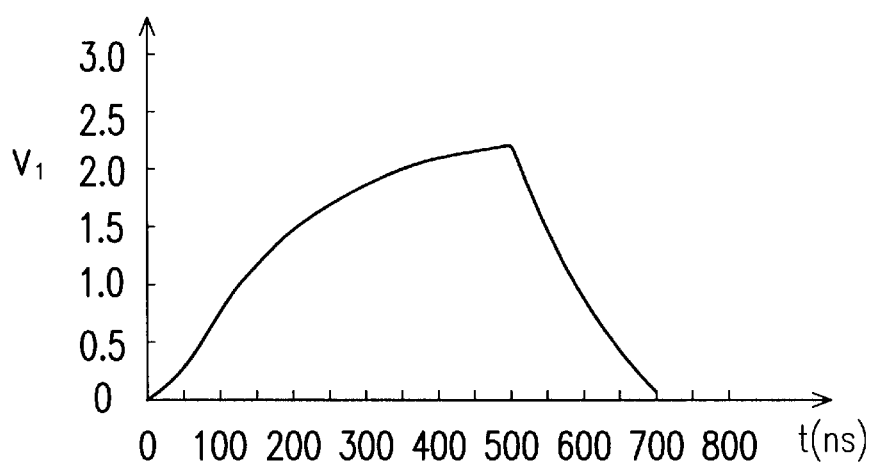

Referring to FIG. 5a, a circuit comprising a resistor and a capacitor is shown. The circuit in FIG. 5a further comprises a diode that is an internal voltage level equivalent to that of an internal circuit of the integrated circuit. In this circuit, there are only the diode, resistor and the capacitor. That is, FIG. 5a shows a circuit without the contact resistance of the pin. In this embodiment, the resistance of the resistor R is 100 Ohms, the capacitance of the capacitor C is about 1.5 nano-farad, so that the RC constant is about 150 nano-seconds. Thus, in FIG. 4, after transmitting through the RC circuit as shown in FIG. 5a, the time-dependent voltage of the testing signal Vss is transformed into the response signal of which the voltage level is shown as shown in FIG. 5b. This is the predetermined result signal mentioned above.

From the response signal as shown in FIG. 5b, the response signal $V_1$ raises from zero volts up to a transition region T (from 1.0 volt to 2.0 volts) at about 150 nano-seconds. At about 300 nano-seconds, the response signal enters a high voltage region between 2.0 volts 3.0 volt, denoted as H. At about 500 nano-seconds, through the high voltage and transition regions, the response signal drops to a low voltage L, ranged between about 0 to 1.0 volt.

Figure 6A:
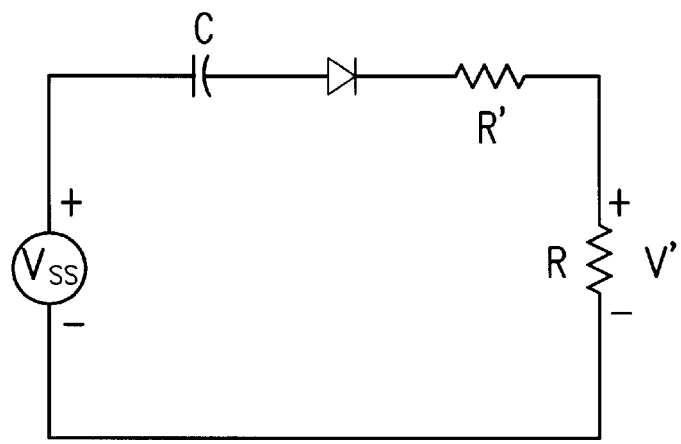
FIG. 6a is a schematic circuit diagram showing the RC circuit in FIG. 5 with an additional resistor added to the pin.

In FIG. 6a, a pin is added to the circuit in FIG. 5a is added with a pin that introduces an additional resistance. The additional resistance R' has a resistance of about 900 Ohms. hat is, FIG. 6a simulates a circuit with a contact resistance of about 900 Ohms between the pin and a channel. The testing signal transmitting through the RC circuit with the diode and the contact resistor of the pin as shown in FIG. 6a is transformed into a response signal with a voltage V' as shown in FIG. 6b.

Figure 6B:
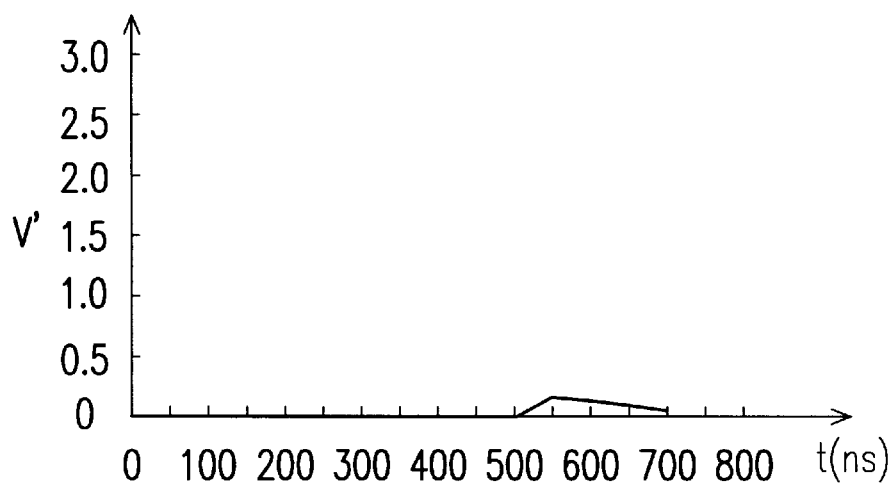

From FIG. 6b, the response signal V' is kept at a low voltage region of about zero volts before about 500 nano-seconds. At about 550 nano-seconds, though V' has raised up to a higher voltage, the higher voltage is still under 0.5 volts. Comparing the highest V' (about 0.15 volt) to the highest $V_1$ (about 2.2 volt), a variation is as high as about 93.19%, which is about 7.3 times the conventional measuring system with the direct current design. Therefore, even when the contact resistance of the pin is very small, it can still be observed or measured to precisely determine whether the device passes or fails. When the specification of a device only allows a small tolerance of error and a more precise measurement is required, the testing circuit 280 and the tester 250 can be used.

Figure 7A:
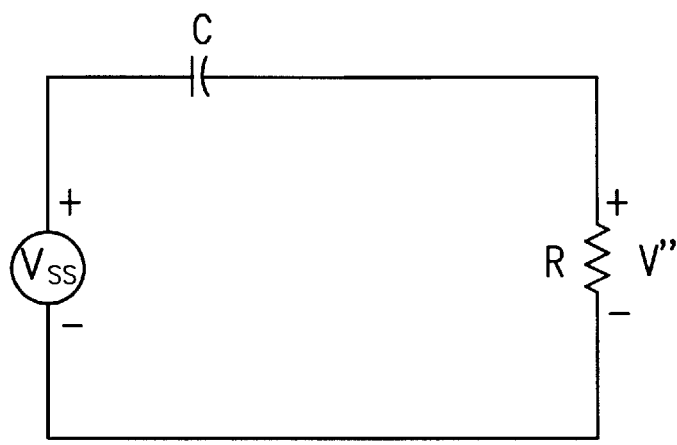
FIG. 7a shows a schematic circuit diagram of FIG. 5a under the circumstance that the integrated circuit has no voltage drop, that is, in a short circuit state.

FIG. 7a shows the circuit in FIG. 5a, however, in a short circuit state, that is, there is no voltage drop in this internal circuit. A testing signal is transformed into a response signal V" as shown in FIG. 7b after experiencing the RC effect of the RC circuit.

Figure 7B:
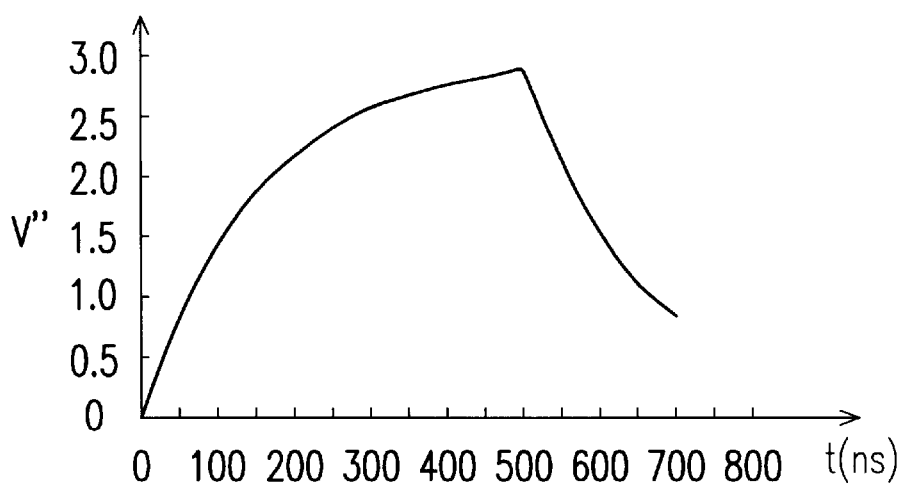

From FIG. 7b, the response signal of V" has a voltage level raising much faster than the response signal of $V_1$. The highest voltage level of V" is about 3.0 volts, while the highest voltage level of $V_1$ is 2.2 volts. The difference between $V_1$ and V" is mainly caused by the existence of the diode that causes a voltage drop.

Referring to FIG. 3, in the step S340, the response signals of the above circuits in FIG. 5a, 6a and 7a are compared to each other. Using the time dependent voltage $V_1$ of a response signal transformed from the testing signal transmitting through the RC circuit only as a reference, the voltage level V' of the response signal transmitting though a circuit with the RC circuit and the pin with contact resistance R' is compared therewith. When the difference of the voltage levels $V_1$ and V' of the response signals obtained from the circuits in FIGS. 5 and 6 exceeds a certain amount, the integrated circuit fails the test. For different kinds of integrated circuits, or different manufacturers, the specification of the integrated circuits may vary. For example, the tolerance of error differs from several hundred millivolts to a few volts. It depends on the specification or the ratings of the integrated circuits. Once the voltage level of the response signal of the circuit with the contact resistance R' of the pin exceeds the tolerance of error, that means the contact resistance of the pin is too high for normal operation. Therefore, the integrated circuit fails the test. On the contrary, if the voltage level is within the tolerance of error, the integrated circuit passes the test and can function properly.

In addition to the above method to test the contact resistance of the pin, the method also provides a method to test whether the voltage level across the internal circuit 205 as shown in FIG. 2 is normal. As mentioned above, the internal circuit typically has a voltage drop equivalent to a voltage drop of a diode or more than one diode. Once the internal circuit response signal V" has a voltage level higher than $V_1$, there might be some fault or defect in the internal circuit 205. Thus, whether the internal circuit 205 is normal or not can also be probed from the behavior of the time dependent voltage V" compared to $V_1$.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A testing system for measuring a contact resistance of a signal pin on an integrated circuit, wherein the integrated circuit comprises the signal pin, a voltage source pin and an internal circuit, the testing system comprising:
    a testing circuit, comprising an RC circuit coupled to the signal pin and the voltage source pin; ,wherein the testing circuit further comprises two switches to control on/off states of the testing circuit and
    a tester, comprising a voltage source and a channel, wherein the voltage source is coupled to the RC testing circuit and the channel is coupled to the signal pin, wherein the channel comprises a probe.

2. The testing system according to claim 1, wherein the RC circuit comprises a resister and a capacitor.

3. The testing system according to claim 2, wherein the resistor has a resistance of 100 Ohms, and the capacitor has a capacitance of 1.5 nano farads.

4. A method for measuring a contact resistance of a signal pin formed on an integrated circuit, the method comprising:
    providing an RC circuit;
    adding a diode with a voltage level equivalent to a voltage drop across an internal circuit of the integrated circuit;
    inputting a testing signal to the RC circuit with the diode;
    obtaining a reference voltage level $V_1$, of a reference response signal to the testing signal through the RC circuit and the diode only;
    coupling the integrated circuit with the RC circuit via the signal pin and a voltage source pin on the integrated circuit;
    inputting the testing signal to the voltage source pin through the RC circuit;
    measuring a voltage level V' of a response signal obtained at the signal pin;
    comparing the voltage level V' to the reference voltage level $V_1$, to obtain a difference in voltage that reflects the magnitude of contact resistance of the signal pin ;and obtaining a voltage level V" of a response signal to a testing singnal with the contact resistance and the RC circuit only without the diode. and obtaining a voltage level V" of a response signal to a testing signal with the contact resistance and the RC circuit only without the diode.

5. The method according to claim 4, wherein the testing signal is in a form of a high voltage level pattern.

6. The method according to claim 4, wherein an operating state of the internal circuit of the integrated circuit can be determined by comparing the voltage level V" with the reference voltage level $V_1$.

* * * * *